US006651134B1

(12) United States Patent
Phelan

(10) Patent No.: US 6,651,134 B1
(45) Date of Patent: Nov. 18, 2003

(54) MEMORY DEVICE WITH FIXED LENGTH NON INTERRUPTIBLE BURST

(75) Inventor: Cathal G. Phelan, Mountain View, CA (US)

(73) Assignee: Cypress Semiconductor Corp., San Jose, CA (US)

(*) Notice: Subject to any disclaimer, the term of this patent is extended or adjusted under 35 U.S.C. 154(b) by 0 days.

(21) Appl. No.: 09/504,344

(22) Filed: Feb. 14, 2000

(51) Int. Cl.[7] .............................................. C06F 12/00
(52) U.S. Cl. ........................ 711/104; 711/105; 711/167; 711/169; 710/35; 365/233; 365/238.5
(58) Field of Search .................... 711/104–105, 169, 711/167; 365/233, 238.5; 710/35

(56) References Cited

U.S. PATENT DOCUMENTS

| 5,651,138 A | * | 7/1997 | Le et al. ..................... 711/154 |
| 5,729,504 A | * | 3/1998 | Cowles ......................... 365/236 |
| 5,805,928 A | * | 9/1998 | Lee .............................. 710/35 |
| 5,936,975 A | * | 8/1999 | Okamura ..................... 714/719 |
| 5,966,724 A | * | 10/1999 | Ryan ............................ 711/105 |
| 6,085,261 A | * | 7/2000 | McIntyre, Jr. et al. ......... 710/35 |
| 6,289,138 B1 | * | 9/2001 | Yip et al. .................... 382/307 |

OTHER PUBLICATIONS

Understanding Burst Modes in Synchronous SRAMs, Cypress Semiconductor Corp., Jun. 30, 1999.

* cited by examiner

Primary Examiner—Donald Sparks
Assistant Examiner—Medhi Namazi
(74) Attorney, Agent, or Firm—Christopher P. Maiorana, P.C.; Robert M. Miller

(57) ABSTRACT

An integrated circuit comprising a memory and a logic circuit. The memory may comprise a plurality of storage elements each configured to read and write data in response to an internal address signal. The logic circuit may be configured to generate a predetermined number of the internal address signals in response to (i) an external address signal, (ii) a clock signal and (iii) one or more control signals. The generation of the predetermined number of internal address signals may be non-interruptible.

21 Claims, 3 Drawing Sheets

MEMORY DEVICE WITH FIXED LENGTH NON INTERRUPTIBLE BURST

FIELD OF THE INVENTION

The present invention relates to memory devices generally and, more particularly, to a memory device that transfers a fixed number of words of data with each access.

BACKGROUND OF THE INVENTION

A synchronous Static Random Access Memory (SRAM) can provide data from multiple address locations using a single address. Accessing multiple locations in response to a single address is called a burst mode access. A memory device that provides a burst mode can reduce activity on the address and control buses. The burst mode of a conventional synchronous SRAM can be started and stopped in response to a control signal.

A conventional Dynamic Random Access Memory (DRAM) preserves data during periodic absences of power by implementing a memory cell as a capacitor and an access transistor. Since the charge on the capacitor will slowly leak away, the cells need to be "refreshed" once every few milliseconds. Depending on the frequency of accesses, a conventional DRAM can need an interrupt to perform data refreshes. Using a DRAM in a burst application is difficult because of the need to refresh. Completely hiding refresh cycles (e.g., refreshing data without the need for interrupts) in a DRAM cannot happen with conventional memory devices due to architecture choices that have been made. Data word bursts can be interrupted while in progress since conventional architectures support both burst and single access modes. Conventional DRAM access takes about 10 ns to get data, but nearly 20 ns to complete writeback and equalization. The addition of another 20 ns for a refresh results in a total access of 40 ns.

Since the data burst transfers of conventional memories can be interrupted and single accesses made, the amount of time that the data, address and control busses are not in use can vary. The variability of bus availability complicates the design of systems with shared data, address and control busses.

It would be desirable to have a memory device that has a fixed burst length.

SUMMARY OF THE INVENTION

The present invention concerns an integrated circuit comprising a memory and a logic circuit. The memory may comprise a plurality of storage elements each configured to read and write data in response to an internal address signal. The logic circuit may be configured to generate a predetermined number of the internal address signals in response to (i) an external address signal, (ii) a clock signal and (iii) one or more control signals. The generation of the predetermined number of internal address signals may be non-interruptible.

The objects, features and advantages of the present invention include providing a fixed burst memory that may (i) give network customers who typically burst large data lengths the ability to set a fixed burst length that suits particular needs; (ii) have non-interruptible bursts; (iii) free up the address bus and control bus for a number of cycles; (iv) provide programmability for setting the burst length by using DC levels [Vss or Vcc] on external pins; (v) hide required DRAM refreshes inside a known fixed burst length of data words; and/or (vi) operate at higher frequencies without needing interrupts to perform refreshes of data.

BRIEF DESCRIPTION OF THE DRAWINGS

These and other objects, features and advantages of the present invention will be apparent from the following detailed description and the appended claims and drawings in which:

DETAILED DESCRIPTION OF THE PREFERRED EMBODIMENTS

Figure 1:
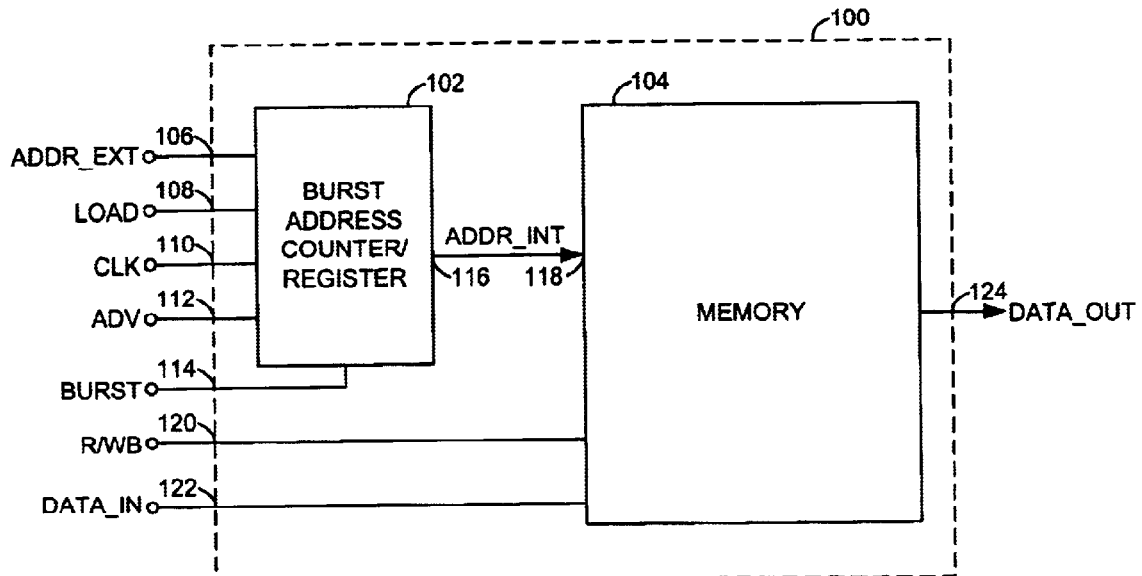
FIG. 1 is a block diagram illustrating a preferred embodiment of the present invention.

Referring to FIG. 1, a block diagram of a circuit 100 is shown in accordance with a preferred embodiment of the present invention. The circuit 100 may be implemented, in one example, as a fixed burst memory. The circuit 100 may be configured to transfer a fixed number of words of data with each access (e.g., read or write). A number of words transferred as a group is called a burst. The circuit 100 generally comprises a circuit 102 and a memory array (or circuit) 104. The circuit 102 may be implemented, in one example, as a burst address counter/register. The memory array 104 may be implemented, in one example, as a static random access memory (SRAM), a dynamic random access memory (DRAM), or other appropriate memory to meet the design criteria of a particular implementation.

The circuit 102 may have an input 106 that may receive a signal (e.g., ADDR_EXT), an input 108 that may receive a signal (e.g., LOAD), an input 110 that may receive a signal (e.g., CLK), an input 112 that may receive a signal (e.g., ADV), and an input 114 that may receive a signal (e.g., BURST). The circuit 102 may have an output 116 that may present a signal (e.g., ADDR_INT) to an input 118 of the memory 104. The memory 104 may have an input 120 that may receive a signal (e.g., R/Wb), an input 122 that may receive a signal (e.g., DATA_IN) and an output 122 that may present a signal (e.g., DATA_OUT). The various signals are generally "on" (e.g., a digital HIGH, or 1) or "off" (e.g., a digital LOW, or 0). However, the particular polarities of the on (e.g., asserted) and off (e.g., de-asserted) states of the signals may be adjusted (e.g., reversed) accordingly to meet the design criteria of a particular implementation.

The signal ADDR_EXT may be, in one example, an external address signal. The signal ADDR_EXT may be n-bits wide, where n is an integer. The signal CLK may be a clock signal. The signal R/Wb may be a control signal that may be in a first state or a second state. When the signal R/Wb is in the first state, the circuit 100 will generally read data from the memory circuit 104 for presentation as the signal DATA_OUT. When the signal R/Wb is in the second state, the circuit 100 will generally store data received as the signal DATA_IN.

The signal LOAD may be, in one example, an address load control signal. The circuit 100 may be configured to load an initial address, presented by the signal ADDR_EXT, in response to the signal LOAD. The initial address may determine the initial location where data transfers to and from the memory 104 will generally begin.

The signal ADV may be, in one example, used as a control signal. The circuit 100 may be configured to transfer a fixed number of words to or from the memory 104 in response to the signals ADV, CLK and R/Wb. When the signal ADV is asserted, the circuit 100 will generally begin transferring a predetermined number of words. The transfer is generally non-interruptible. In one example, the signal ADV may initiate the generation of a number of addresses for presentation as the signal ADDR_INT.

The signals ADV and LOAD may be, in one example, a single signal (e.g., ADV/LDb). The signal ADV/LDb may be a control signal that may be in a first state or a second state. When the signal ADV/LDb is in the first state, the circuit 102 will generally load an address presented by the signal ADDR_EXT as an initial address. When the signal ADV/LDb is in the second state, the circuit 102 may be configured to generate the signal ADDR_INT as a fixed number of addresses in response to the signal CLK. The signal ADDR_INT may be, in one example, an internal address signal. The signal ADDR_INT may be n-bits wide. Once the circuit 102 has started generating the fixed number of addresses, the circuit 102 will generally not stop until the fixed number of addresses has been generated (e.g., a non-interruptible burst).

The signal BURST may be, in one example, a configuration signal for programming the fixed number of addresses that the circuit 102 may generate in response to the signals CLK and ADV/LDb. The signal BURST may be generated, in one example, by (i) using bond options, (ii) voltage levels applied to external pins, or (iii) other appropriate signal generation means.

When the memory 104 is implemented as a DRAM, the circuit 100 may be configured to hide required DRAM refreshes (e.g., refreshes may occur without affecting external environment) inside a known fixed burst length of data words. The fixed burst length may allow the circuit 100 to operate at higher frequencies than a conventional DRAM without needing interrupts to perform refreshes of data. In one example, the fixed burst length may be four or eight words. However, the burst length may be set to whatever length is necessary to meet the design criteria of a particular application. For example, the burst length may be programmed, in one example, to allow both writeback and refresh to occur within a single access. The fixed burst-length may be set, in one example, longer or shorter depending upon a frequency or technology to be used.

The circuit 100 may be configured to provide a fixed burst length that may suit the requirements of network customers who typically burst large data lengths. By providing a fixed burst length, the circuit 100 may allow shared usage of data, address and control busses. A fixed length non-interruptible burst generally frees up the address bus and control bus for a known number of cycles. The address and control busses may be shared by a number of memory devices. The circuit 100 may provide a more reliable and/or accurate burst than is possible with multiple chips.

Figure 2:
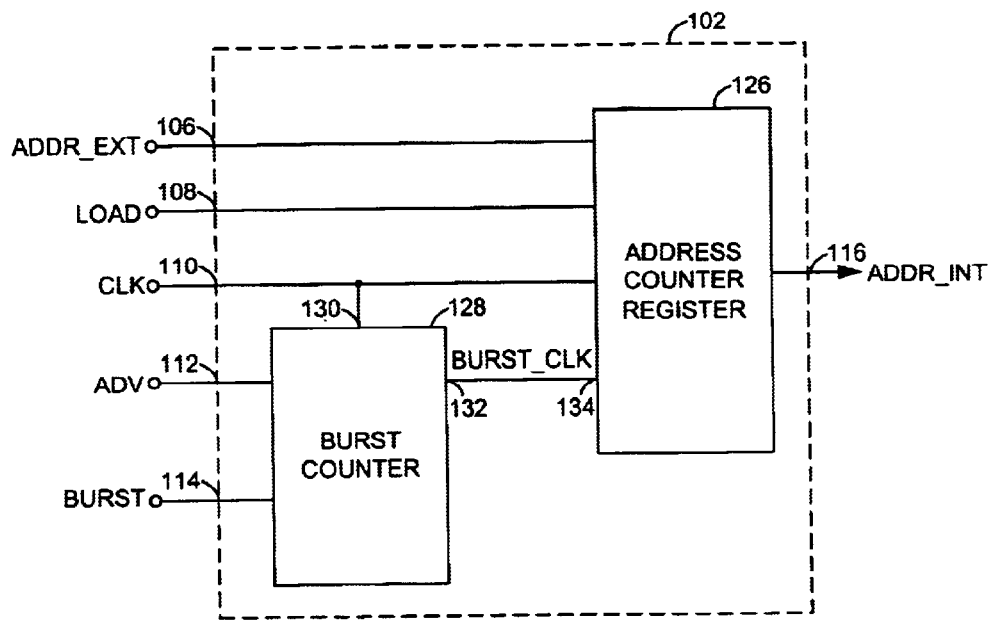
FIG. 2 is a detailed block diagram illustrating a circuit 102 of FIG. 1.

Referring to FIG. 2, a detailed block diagram illustrating implementation of the circuit 102 is shown. The circuit 102 may comprise an address counter register 126 and a burst counter 128. The address counter register 126 generally receives the signals ADDR_EXT, LOAD, and CLK. The address counter register 126 may be configured to present the signal ADDR_INT. The signal ADV and the signal BURST may be presented to a burst counter 128. The signal CLK may be presented at an input 130 of the burst counter 128. The burst counter 128 may have an output 132 that may present a signal (e.g., BURST_CLK) at an input 134 of the circuit 126. An initial address may be loaded into the address counter register 126 by presenting the initial address in the signal ADDR_EXT and asserting the signal LOAD. The circuit 126 may be configured to increment an address in response to the signal BURST_CLK. When the signal ADV is asserted, the burst counter 128 will generally present the signal BURST_CLK in response to the signal CLK. The signal BURST_CLK generally contains a number of pulses that has been programmed by the signal BURST.

Figure 3:
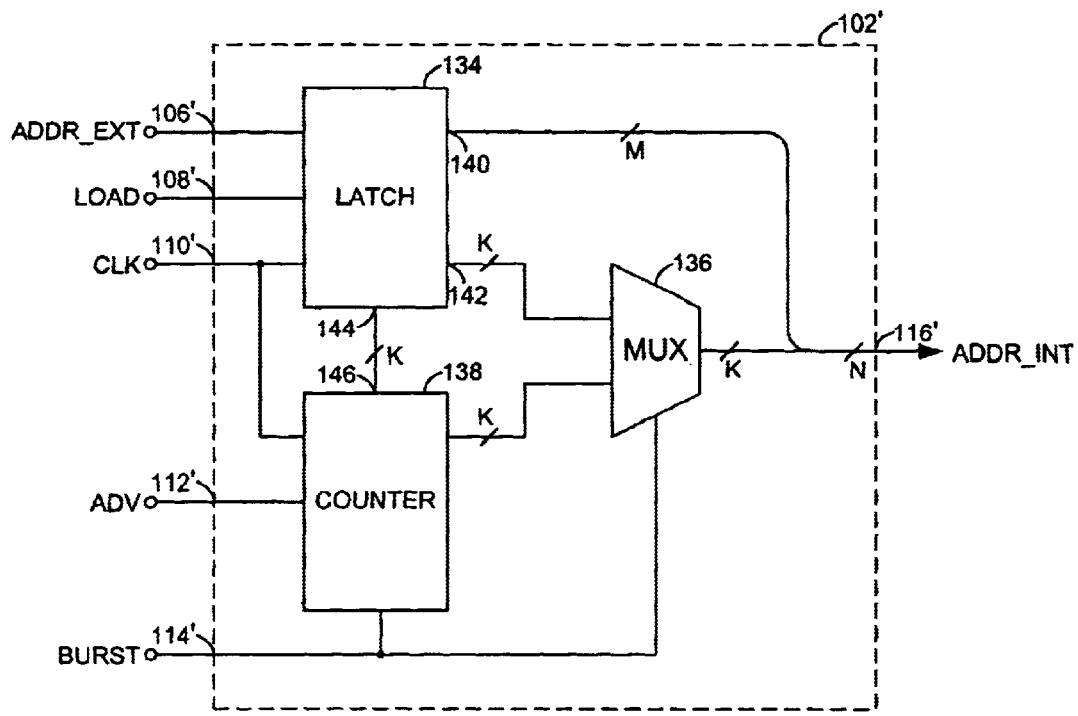
FIG. 3 is a detailed block diagram of a circuit 102' illustrating an alternative embodiment of the circuit 102 of FIG. 1.

Referring to FIG. 3, a detailed block diagram illustrating an alternative embodiment of the circuit 102 is shown. The circuit 102' may comprise a latch 134, a multiplexer 136 and a counter 138. The signals ADDR_EXT, LOAD and CLK may be presented to the latch 134. The latch 134 may have an output 140 that may present a portion (e.g., m bits, where m is an integer smaller than n) of the signal ADDR_EXT as a portion of the signal ADDR_INT, an output 142 that may present a second portion (e.g., k bits, where k is an integer smaller than n) of the signal ADDR_EXT to a first input of the multiplexer 136, and an output 144 that may present the second portion of the signal ADDR_EXT to an input 146 of the counter 138.

The signals ADV, CLK and BURST may be presented to inputs of the counter 138. The counter 138 may be configured to generate a number of addresses in response to the signals CLK, BURST and ADV. The number of addresses generated by the counter 138 may be programmed by the signal BURST.

The signal BURST may be presented to a control input of the multiplexer 136. The multiplexer 136 may select between a number of signals from the latch 134 and a number of signals from the counter 138 to be presented as a second portion of the signal ADDR_INT in response to the signal BURST.

Figure 4:
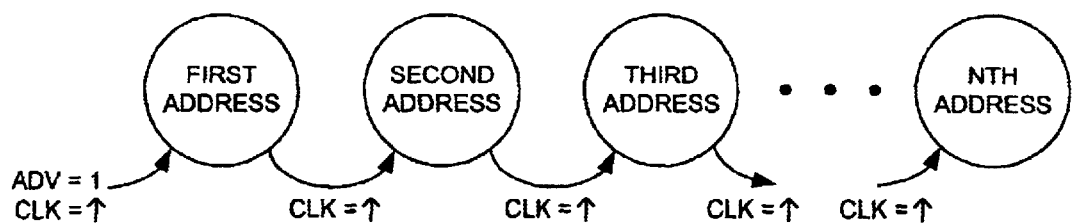
FIG. 4 is a flow diagram illustrating an example burst address sequence.

Referring to FIG. 4, a flow diagram illustrating an example burst address sequence is shown. When the signal ADV is asserted, the circuit 100 will generally generate a number of address signals, for example, N where N is an integer. The address signals may be generated, in one example, on a rising edge of the signal CLK. The address signals will generally continue to be generated until the Nth address signal is generated.

Figure 5A:
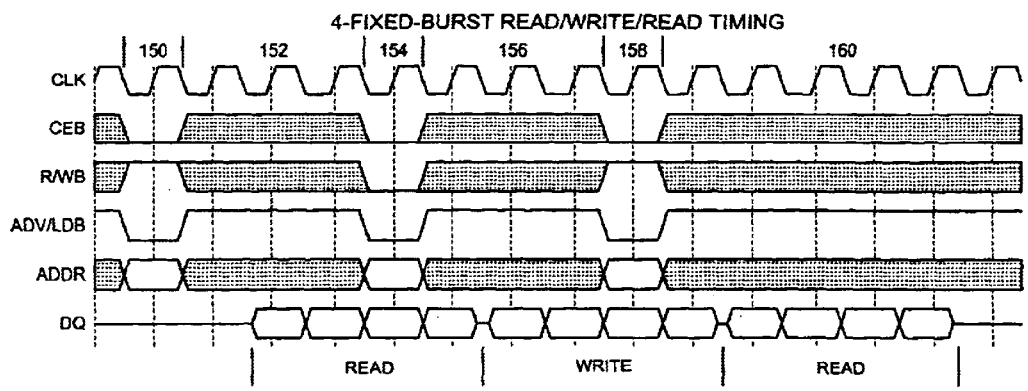
FIGS. 5A and 5B are diagrams illustrating example operations of a 4 word (FIG. 5A) and an 8 word (FIG. 5B) fixed burst access in accordance with the present invention.
Figure 5B:
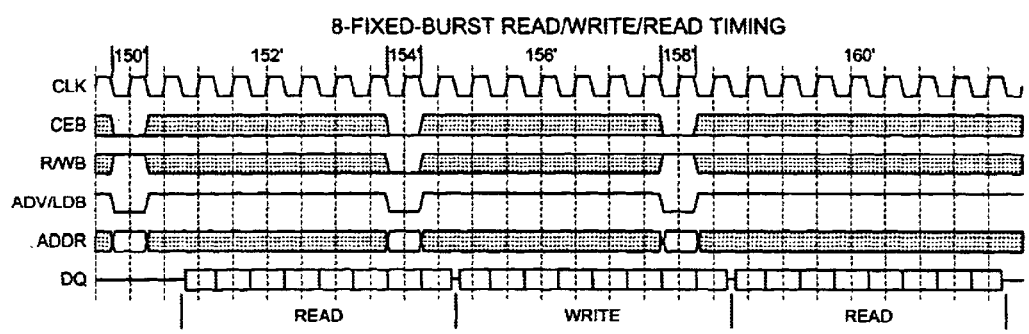

Referring to FIGS. 5A and 5B, timing diagrams illustrating example operations for a four word (FIG. 5A) and an eight word (FIG. 5B) fixed burst memory in accordance with the present invention are shown. The timing diagrams generally illustrate externally measurable signals for four and eight word fixed burst read/write architectures. In general, an operation (e.g., read or write) of the circuit 100 begins with loading an initial address (e.g., portions 150, 154, and 158 of FIG. 5A; portions 150', 154', and 158' of FIG. 5B). Starting with the initial address, a fixed number of words are generally transferred (e.g., line DQ of FIGS. 5A and 5B). During the transfer of the fixed number of words, the address and control buses (e.g., ADDR, CE, R/W, etc.) are generally available to other devices (e.g., portions 152, 156, and 160 of FIG. 5A; portions 152', 156', and 160' of FIG. 5B). In one example, the control and address bus activity may be one-fourth (FIG. 5A) or one-eighth (FIG. 5B) the data bus activity (e.g., compare line ADDR with line DQ of FIGS. 5A and 5B). The reduced bus activity may be an effect of the architecture. The data bus may be, in one example, active nearly 100% of the time (e.g., line DQ of FIGS. 5A and 5B) In one example, there may be no inefficiencies switching from read to write to read etcetera (e.g., see labels under line DQ of FIGS. 5A and 5B).

Figure 6:
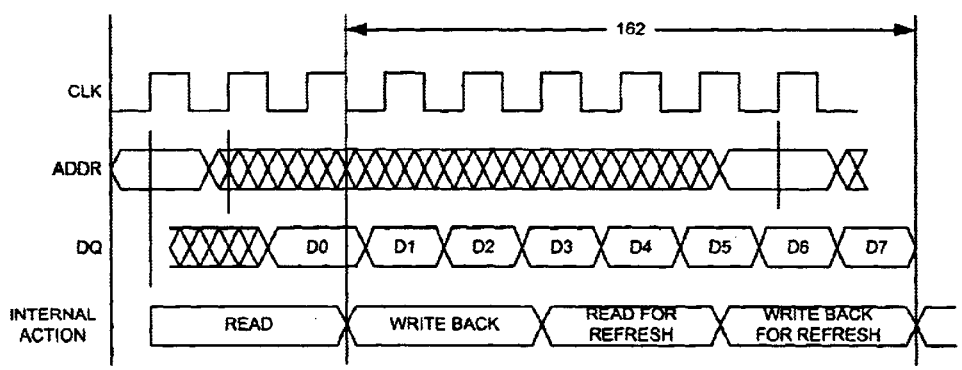
FIG. 6 is a diagram illustrating an example operation where a burst length may be long enough to include a writeback and a refresh cycle.

Referring to FIG. 6, a timing diagram illustrating a fixed burst length long enough to hide a writeback and a refresh cycle is shown. Internally the action being performed may completely hide DRAM refresh activity inside nominal external activities. A portion 162 illustrates that refresh activity (e.g., writeback, read for refresh, and writeback for refresh) may be completed within the time of the burst transfer. When a fixed burst long enough to completely hide refresh activity is provided, there may be no penalty for using DRAM instead of SRAM for the memory 104.

While the invention has been particularly shown and described with reference to the preferred embodiments thereof, it will be understood by those skilled in the art that various changes in form and details may be made without departing from the spirit and scope of the invention.

What is claimed is:

1. A circuit comprising:
    a memory comprising a plurality of storage elements each configured to read and write data in response to an internal address signal; and
    a logic circuit configured to generate a predetermined number of said internal address signals in response to (i) an external address signal, (ii) a clock signal and (iii) one or more control signals, wherein said generation of said predetermined number of internal address signals is non-interruptible.

2. The circuit according to claim 1, wherein said predetermined number of internal address signals is determined by a fixed burst length.

3. The circuit according to claim 1, wherein said predetermined number of internal address signals is at least 4.

4. The circuit according to claim 1, wherein said predetermined number of internal address signals is 8.

5. The circuit according to claim 2, wherein said fixed burst length is programmable.

6. The circuit according to claim 5, wherein said fixed burst length is programmed by bond options.

7. The circuit according to claim 5, wherein said fixed burst length is programmed by voltage levels on external pins.

8. The circuit according to claim 1, wherein said memory comprises a static random access memory.

9. The circuit according to claim 1, wherein said memory comprises a dynamic random access memory.

10. The circuit according to claim 9, wherein said predetermined number of internal address signals is chosen to provide time for at least one writeback or refresh cycle.

11. The circuit according to claim 1, wherein said predetermined number of internal address signals is chosen to meet predetermined criteria for sharing address and control busses.

12. The circuit according to claim 1, wherein said logic circuit comprises a counter configured to generate said predetermined number of internal address signals.

13. The circuit according to claim 1, wherein said external address signal comprises an initial address for data transfers to and from said memory.

14. A memory device according to claim 1, wherein said circuit is an integrated circuit.

15. The circuit according to claim 1, further comprising address and control busses configured to present said external address signal and said one or more control signals, wherein said busses are freed up during the generation of said predetermined number of internal address signals.

16. A circuit comprising:
    means for reading data from and writing data to a plurality of storage elements in response to a plurality of internal address signals; and
    means for generating a predetermined number of said internal address signals in response to (i) an external address signal, (ii) a clock signal and (iii) one or more control signals, wherein said generation of said predetermined number of internal address signals is non-interruptible.

17. A method of providing a fixed burst length data transfer comprising the steps of:
    accessing a memory in response to a plurality of internal address signals; and
    generating a predetermined number of said internal address signals in response to (i) an external address signal, (ii) a clock signal and (iii) a control signal, wherein said generation of said predetermined number of internal address signals is non-interruptible.

18. The method according to claim 17, further comprising the step of programming said predetermined number.

19. The method according to claim 18, wherein said programming step is performed using bond options.

20. The method according to claim 18, wherein said programming step is performed using voltage levels.

21. The method according to claim 17, further comprising the step of selecting said predetermined number to provide time for at least one writeback or refresh cycle.

* * * * *